(12) United States Patent
Rimini et al.

(10) Patent No.: US 6,836,647 B2
(45) Date of Patent: Dec. 28, 2004

(54) DEVICE AND METHOD FOR CDMA-SIGNAL POWER ESTIMATION

(75) Inventors: Roberto Rimini, San Diego, CA (US); Nick Carbone, San Diego, CA (US)

(73) Assignee: Nokia Corporation, Espoo (FI)

( * ) Notice: Subject to any disclaimer, the term of this patent is extended or adjusted under 35 U.S.C. 154(b) by 406 days.

(21) Appl. No.: 10/120,569

(22) Filed: Apr. 10, 2002

(65) Prior Publication Data

US 2003/0194981 A1 Oct. 16, 2003

(51) Int. Cl.[7] .............................................. H04B 17/00
(52) U.S. Cl. ............................... 455/226.2; 455/234.1; 455/245.1; 375/345
(58) Field of Search ........................... 455/226.1, 226.2, 455/232.1, 234.1, 234.2, 240.1, 245.1, 247.1; 375/340, 345

(56) References Cited

U.S. PATENT DOCUMENTS

| | | | | |
|---|---|---|---|---|
| 5,267,272 A | * | 11/1993 | Cai et al. ..................... 375/345 |
| 6,121,828 A | * | 9/2000 | Sasaki ......................... 329/304 |
| 6,324,230 B1 | * | 11/2001 | Graham et al. ............. 375/345 |
| 6,498,927 B2 | * | 12/2002 | Kang et al. ............... 455/245.2 |
| 6,731,703 B2 | * | 5/2004 | Kurihara ..................... 375/345 |

* cited by examiner

*Primary Examiner*—Quochien B. Vuong
*Assistant Examiner*—Nhan Le

(57) ABSTRACT

A system and method for estimating the power-level of a signal received at a mobile-station receiver operating in a wireless network according to a CDMA standard. An analog automatic gain controller (AGC) loop, a digital filter, and a digital AGC loop are used, in sequence, to process a received RF signal that has been amplified, converted to baseband, and filtered using an analog baseband signal. The linear gain values of the analog AGC and the digital AGC are multiplied to produce a gain-value product. The logarithm of the gain-value product is used for executing the power-estimating function by comparison to a predetermined received-signal power estimation curve.

16 Claims, 5 Drawing Sheets

US 6,836,647 B2

DEVICE AND METHOD FOR CDMA-SIGNAL POWER ESTIMATION

The present invention relates generally to wireless telecommunication systems, and more specifically to reliably estimating the power of a signal received in a receiver operating according to a CDMA (or similar) standard, even if the signal includes a significant amount of interference. The present invention is especially useful when the receiver uses the economically advantageous direct-conversion architecture because the direct-conversion open-loop power control circuit filters out less interference when compared to a standard super-heterodyne receiver.

BACKGROUND OF THE INVENTION

Wireless telecommunication technology has revolutionized the way people communicate over a distance. From the inception of modern telecommunication systems in the nineteenth century, virtually all such systems, save those relying on line-of-sight, are operated over a wire. Using a pattern of electrical signals transmitted from one end of the wire to the other, devices at each end have been able to establish effective and reliable communications. More accurately, to traverse long distances the electrical signals traveled a number of wires interconnected by switches to form a network. The switches permit almost any desired combination of wires to be connected so that any device may connect and communicate with any other, so long as they are both linked to the network and not otherwise occupied. This type of network, which started as telegraph and became telephone, is now often referred to as the plain-old telephone system (POTS). Similar private or limited-access networks are also in current use. Such networks provide a reliable vehicle for communications traffic, including voice and data, between devices such as telephones and computers. The main disadvantage of the POTS and similar wire line systems is that these devices must be located at a network-access point to which they are physically connected, and cannot be relocated during an ongoing communication session. In addition, whatever network resources are employed to establish the continuous connection between the calling party and the called party must remain so employed for the duration of the session-even at intervals where no actual communication is taking place.

Wireless communications, which rely chiefly on radio waves, address both of these concerns. Although the first radio transmission took place years ago, it is only in the relatively recent past that the technology has progressed to allow widespread use of wireless communication by the general population. A great many people now subscribe to mobile as well as (or instead of) wireline service. Typically, subscribers will have one or more mobile stations capable of radio communication with network transceivers located through the network coverage area. The mobile station itself includes a transmitter and a receiver, and will usually be a telephone, computer, personal digital assistant (PDA), or similar device. Naturally, there is no requirement that the mobile station actually be movable, and as used herein the term "mobile station" will apply to these devices and any others similarly capable of radio communication with a wireless network.

FIG. 1 is a block diagram illustrating selected components of a typical wireless network 100, as might be used in communicating with mobile stations practicing received-power estimation according to the present invention. The network 100 includes a plurality of base service stations (BSSs), here BSS 105, BSS 110, and BSS 115. Although only three BSSs are shown, however, in an actual network there would be a great many. Each BSS includes a base station transceiver (BST) and a base station controller (BSC). In FIG. 1, for example, BST 106 and BSC 107 are included in BSS 105; BST 111 and BSC 112 in BSS 110; and BST 116 and BSC 117 in BSS 115. Alternately, a single BSC may control a number of BSTs. The coverage area of network 100 is divided into a number of cells, each having a BST (and perhaps a BSC). For purposes of illustration, three cells are enumerated in FIG. 1 as cell 104, cell 109, and cell 114. A typical network has many such cells that, unlike these illustrated in FIG. 1, may vary in size and overlap each other.

Individual subscribers use mobile stations, such as mobile station (MS) 130, to communicate with and through the network, usually through the BST covering the cell in which the mobile station is currently located, or the BST of a neighboring cell. In this way each radio frequency being used for mobile station to base station communication may be re-used for similar communications in another cell, so long as the other cell is sufficiently far away to prevent the signals from crossing or interfering with one another. Naturally, transmission power is limited so that transmissions taking place in one cell do not reach (at significant levels) another cell where the same frequency is being used. In the embodiment of FIG. 1, MS 130 is in communication with BSS 115 through a radio-frequency (RF) link 135. RF link 135 includes a forward link 136, which carries transmissions from BST 116 to MS 130, and a reverse link 137, which the MS 130 uses for transmitting to BST 116. Reverse link 137 may be used for both traffic (actual communication) and control signaling. The same is true of forward link 136, which includes a pilot channel, a sync channel, and a paging channel. A pilot channel signal is transmitted continuously by each BST and is the means by which a mobile station locates a base station so that it can register (makes its presence known to the network) or establish a voice or data link for actual communication. The sync-channel message allows each mobile station to obtain frame synchronization of the CDMA signal. The paging channel is used for paging mobile stations to provide notice of incoming calls, and for similar messages.

Under ordinary conditions, MS 130 communicates only with BSS 115 while located in cell 114. As it travels toward, for example, cell 109, it detects that the pilot channel message from BSS 110 is getting stronger, and may establish communication with it as well. (The network may also allow for communication through the BSSs associated with neighboring cells where the closest BSS is available.) This redundancy enables continuity of communication as MS 130 relocates. When a mobile station travels from one cell to another, it switches from one BST to another in a process called "hand off." Ideally, communications with the second BST will be established before the link to the original BST is broken, in which case (called "soft hand-off") the subscriber will perceive little or no break in the transmission.

BSSs may communicate directly with one another, such as BSS 105 and BSS 110 of FIG. 1, although they are all connected directly or indirectly through a mobile switching center (MSC) such as MSC 120. MSC 120 switches voice calls between mobile stations communicating with BSSs it is connected to, and switches calls to any other devices through the network (not shown) itself. Information concerning the mobile stations operating in the area is stored in a Visitor Location Register (VLR) database 122, which is connected to the MSC 120. MSC 120 may also include a packet-data switching node (PDSN) 124 that similarly switches packet data to and from more modern mobile stations.

As mentioned above, cellular telephony's frequency re-use allows many more subscribers to be actively communicating than would otherwise be possible. That is, if all of the mobile stations in, for example, were each allocated their own frequency to use anywhere in a large metropolitan area, the available channels would soon be exhausted and busy signals would be very common. With frequency re-use, however, the same frequency channel being used by one mobile station may be assigned to another operating only a few miles away.

In addition, several multiple access schemes have been developed. Standard frequency-division multiple access (FDMA) simply divides the available transmission spectrum (bandwidth) into individual channels, and assigns these channels as they are needed for voice or data communications. In any such communication session, however, a significant amount of the time no actual transmission will be taking place; the channel is simply not need all of the time. It is assigned, however, for the duration of the session, meaning it cannot be used by another (local) subscriber. A multiple-access scheme permits users operating in the same or neighboring cells to share a frequency channel.

In a TDMA scheme, for example, each available frequency is divided up into time slots, with individual communication channels being defined by a particular time slot at a given frequency. If the number of time slots is kept low enough, almost any transmission may be sent without a delay perceivable to the subscriber. Using TDMA, many more simultaneous communications may take place within a given call. Of course, the sending station and the receiving station must be synchronized so that each used the appropriate time slot, meaning that the mobile stations must be somewhat more sophisticated. Nevertheless, a significant advantage is thereby gained when time-division multiple access (TDMA) is employed.

Another multiple access scheme is code-division multiple access (CDMA). CDMA does not involve dividing the available bandwidth into separate frequency channels at all, but instead uses a spread-spectrum transmission method. In a spread-spectrum system encoded transmissions are spread over the available transmission bandwidth using pseudorandom noise (PN) codes. Channelization is provided by additionally spreading the channel with one of 64 available waveforms called Walsh codes. Each mobile station establishing contact with a BSS is assigned a Walsh code, which is transmitted to the mobile station and used there to decode the received signal. Only the transmission intended for the particular mobile station may be received by it because its assigned Walsh code is (substantially) mutually orthogonal to other Walsh codes. Careful synchronization between the base station and each mobile station it is communicating with is necessary to ensure proper reception. Each BST continually transmits a sync message on the sync channel for this purpose. As with TDMA, however, the additional sophistication required in a CDMA system is justified by the relatively large number of subscribes that will be permitted to use the network simultaneously.

The CDMA multiple-access scheme currently operates according to a standard known as IS-95 standard, or according to its newer counterpart, IS-2000. The two standards are basically compatible, such that equipment constructed according to one may communicate with equipment constructed according to the other. IS-2000 (sometimes referred to as CDMA 2000), however, provides for the efficient transmission of data and multimedia content. The present invention may be advantageously employed with either IS-95 or IS-2000. Because it is not exclusively associated with either revision, the term "CDMA" will herein include both of them and any future versions.

Receivers operating according to the CDMA standard will be most advantageously used in accordance with the present invention because CDMA mobile stations employ variable transmission-power scheme. That is, the power level of separate transmissions may be raised or lowered, with the goal being that no transmission is over-powered. This both conserves mobile station power, which is often supplied by a battery, and minimizes cross-channel interference. Such power control is essential in any system, such as CDMA, where many subscribers are actually sharing the same frequency. There are several methods for controlling mobile-station transmission power. In open-loop control, the mobile station determines how much power to use for transmission by analyzing the power-level of a signal received from the base station. Typically, the base-station signal used is a calibration constant transmitted on the sync channel. The sync-channel signal power, of course, decreases with distance and so becomes weaker as the distance from the mobile station to the base station increases. Upon sensing this attenuation, the mobile station adjusts transmission power accordingly.

In one open-loop method of estimating the power-level of a received CDMA signal is to employ an analog automatic-gain-control (AGC) circuit is employed. As the received signal is processed, the AGC attempts to keep constant the power level of the signal as supplied to an analog-to-digital (A/D) converter used prior to demodulation. The gain value required to do this will vary with the power level of the signal actually received, and the former can therefore be used to estimate the latter. This method has been successfully employed, for example, in the traditionally-used super-heterodyne receiver, as described below.

FIG. 2 is a block diagram illustrating the open-loop power estimation components of a typical super-heterodyne receiver 200 of the prior art. The analog AGC loop 210, exemplary of those referred to above, is delineated by a broken line. Before passing through this loop, however, the received (RF) signal is amplified by a low-noise amplifier (LNA) 220. The amplified signal is sent to a mixer 225, where it is down-converted to an intermediate frequency (IF). As indicated in the "Legend" of FIG. 2, after mixing the signal includes a real part and an imaginary part. The complex IF signal is supplied to a surface-acoustic wave (SAW) filter 230, which substantially attenuates any interference associated with the received signal. The signal is then passed through a second mixer 235, which down-converts it to baseband. The baseband signal is then supplied to a baseband analog filter 240, which removes most, if not all, of the remaining interference that was previously associated with the received signal.

The filtered baseband signal is then supplied to a variable-gain amplifier 250 controlled by the analog AGC circuit 255 of the aforementioned AGC loop 210. The input for the analog AGC 255 is the output of A/D converter 260, which process the signal output from the variable-gain amplifier 250. Note that in this embodiment the AGC 255 also sets a gain value for the low-noise amplifier. It is the gain value supplied to the variable-gain amplifier, however, that is used by received-power estimation circuit 270 to estimate the power of the received signal. Received-signal power, in other words, is estimated by monitoring the analog gain-value necessary to maintain the output of variable-gain amplifier 250 to A/D converter 260 at a constant, predetermined level. The stronger the incoming signal, the less adjustment is necessary.

Note that in the super-heterodyne receiver circuitry 200 of FIG. 2, the IF-SAW filter 230 and the baseband analog filter 240 collectively remove most or substantially all of the originally present side-channel interference. This means that the gain values set by the AGC do not reflect also the power level associated with the interference. If this IF filtering is not done, the gain value may be less, causing received-power estimator 220 to over-estimate the received signal power.

So-called direct-conversion CDMA receivers are currently being developed, however, that for reasons of economy do not include an IF-SAW filter. Accurate power estimation according to the configuration of FIG. 2 is therefore not feasible. The higher level of interference remaining in the signal provided to the AGC makes the gain value an inaccurate power-estimation value. Needed, then, is a way to accurately estimate the power of a received RF signal. The present invention provides just such a device and method.

SUMMARY OF THE INVENTION

The present invention is directed to a device and method for estimating the power level of a received signal in a wireless telecom network, such as one constructed according to a CDMA standard. In one aspect, the present invention is a receiver circuit having a first AGC loop and a second AGC loop. In a preferred embodiment the first loop precedes the second and is an analog AGC loop, and the second is a digital AGC loop separated from the first by a digital filter. The system further includes a multiplier for multiplying the gain value set by the analog AGC with the gain value set by the digital AGC to produce a gain-value product. The logarithm of the gain-value product is then used to estimate CDMA power by applying it to an equation having pre-set parameters.

In another aspect, the present invention is a method for estimating the power level of a received CDMA signal, including the steps of amplifying the received signal, filtering the received signal through an analog baseband filter, and supplying the filtered signal to an analog AGC loop. The method further includes the steps of filtering the output of the AGC loop using a digital filter and providing the digitally-filtered output to a digital AGC loop. The linear gain value set by the analog AGC loop is the multiplied with the linear value of the digital-AGC-loop gain value to produce a gain-value product. Finally, the received signal power level is estimated by comparing the logarithm of the gain-value product to the power estimation curve associated with the receiver receiving the signal.

DETAILED DESCRIPTION

The present invention provides a device and method for estimating the power level of a received CDMA (or similar) RF signal. The estimated power level provides an indication of the transmission power needed to send a communication signal back to the original sending station. This sending station is generally a base station in a wireless network, and the power-level estimation is performed by a mobile station linked to the base station. Regulatory mobile-station transmission power helps to equalize the various mobile-station signals received at the base station, regardless of its distance to the mobile transmitter.

Figure 3:
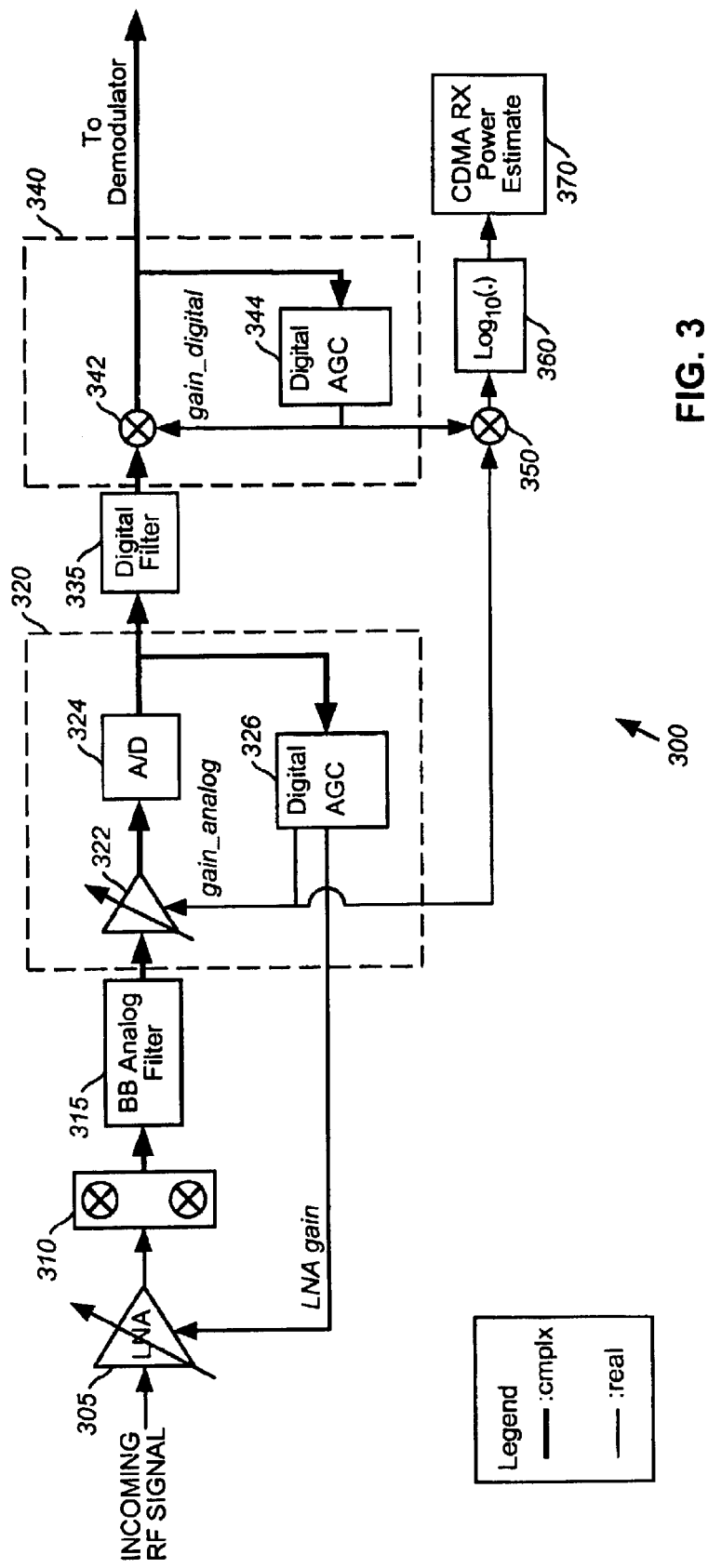
FIG. 3 is a block diagram illustrating the power-estimation components of a direct-conversion-architecture receiver configured according to an embodiment of the present invention.

FIG. 3 is a block diagram illustrating selected components of a direct-conversion receiver 300 configured according to an embodiment of the present invention. In this embodiment, received-signal power estimation is accomplished using two automatic gain control (AGC) loops, delineated with broken lines as analog AGC loop 320 and digital AGC loop 340. The input to analog AGC loop 320 occurs at variable-gain amplifier 322, which receives and amplifies a complex signal from baseband analog filter 315. The amplified complex signal from variable-gain amplifier 322 becomes the input for the analog-to-digital (A/D) converter 324. The complex output from AID converter 324 is, in turn, the input for analog AGC 326. The output from the analog AGC 326 is an analog-gain value, which is used to control variable-gain amplifier 322. Variable gain amplifier 322 in this configuration attempts to keep constant at a pre-determined level the power level of the output to A/D converter 324.

As mentioned above, the input to analog AGC loop 320 is received from baseband analog filter 315. This filter receives the complex baseband signal from mixer 310, which down-converts the received RF signal after it has been amplified by low-noise amplifier (LNA) 305. LNA 305 is preferably controlled by an LNA gain-value, also output from analog AGC 326.

Figure 1:
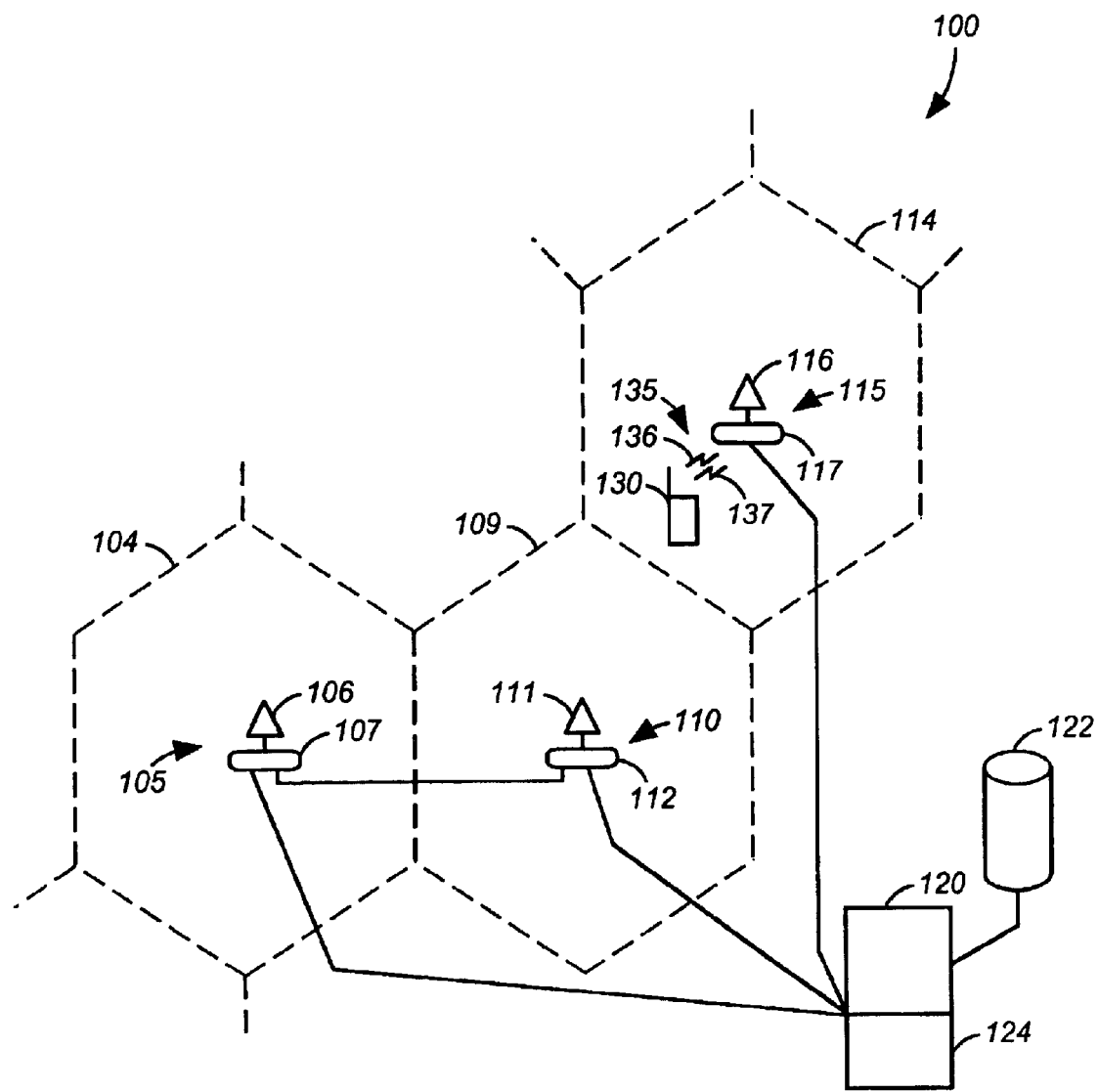
FIG. 1 is a block diagram illustrating selected components of a typical wireless telecommunication network as might be used in communicating with mobile stations practicing received-power estimation according to the present invention.
Figure 2:
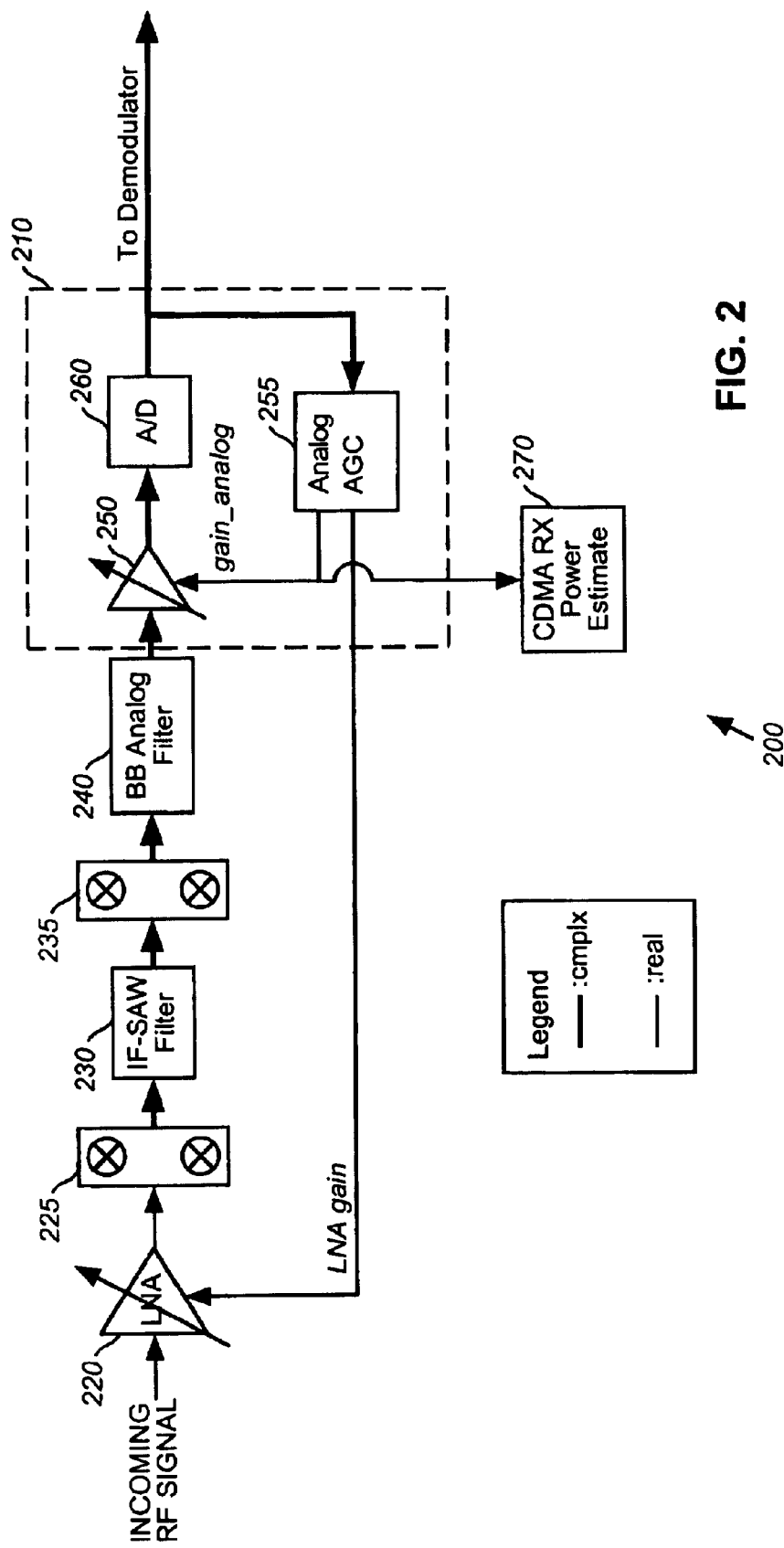
FIG. 2 is a block diagram illustrating the power estimation components of a typical super-heterodyne receiver of the prior art.

Note that, as compared with the super-heterodyne receiver 200 of FIG. 2, the receiver 300 lacks the additional mixer 225 and IF—SAW filter 230. Direct-conversion architecture does not use the intermediate frequency (IF) as the super-heterodyne receiver does. While certain desirable economies are reached in this fashion, this configuration also means that the signal output from loop 320 (through A/D converter 324) still contains a significant noise element. The analog-gain value of course reflects this, requiring less amplification given the presence of the noise and the power contributed by it. It is not know at this point in processing the signal, however, how much of the total power level is attributable to the noise and how much to the received signal itself. Save for the case where interference is negligible, any power estimate made using the analog-gain value alone will therefore indicate that the base station is closer than it actually is, and as a result signals transmitted from the mobile station may be too weak for effective communication.

According to the solution of the present invention, this problem of being unable to accurately estimate the received-signal power in a direct-conversion receiver is addressed through the use of digital AGC loop 340. Digital AGC loop 340 receives the signal output by loop 320 after it has been passed through digital filter 335. The digitally-filtered signal is then rescaled in multiplier 342 using the digital-gain value output by digital AGC 344. The rescaled output from multiplier 342 is then fed back into the digital AGC 344, and at the same time transmitted from digital AGC loop 340 to the receiver's demodulator for further processing.

To execute the power-estimation function of the present invention, outputs from both the analog AGC loop 320 and the digital AGC loop 340 are combined. Specifically, in the embodiment of FIG. 3, the linear values of the analog gain value from analog AGC 326 and the digital gain value from the digital AGC 344 are multiplied in multiplier 350 to obtain a gain-value product. It has been found through experimentation that the logarithm of the gain-value product has a direct relationship to the value of the received-signal power. In the embodiment of FIG. 3, logarithmic function 310 determines the base-10 logarithm of the gain-value product, which it outputs to the received-power estimation circuit 370. Received-power estimation circuit 370 uses this value to estimate the power level of the received radio-frequency (RF) signal. More detail on the received-signal power estimation function will now be provided.

Figure 4:
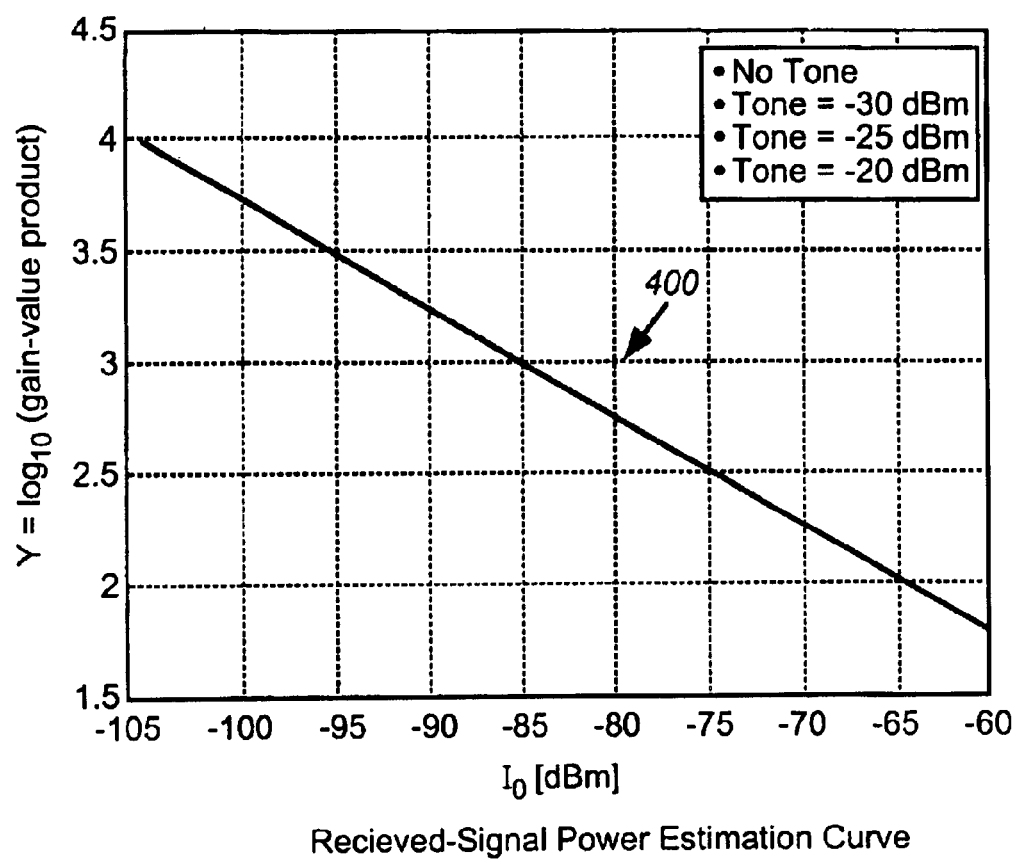
FIG. 4 is a received-signal power estimation curve illustrating the relationship of the received signal strength to the (base-10) logarithm of the gain-value product, as determined according to the device and method of the present invention.

FIG. 4 is a received-signal power estimation curve 400 illustrating the relationship of received-signal power ($I_O$) to the (base-10) logarithm of the gain-value product (Y), as determined according to the device and method of the present invention. It has been found that a substantially linear relationship exists, and that for a given receiver the relationship of the received-signal power to $\log_{10}$ (gain-value product) is the same regardless of the amount of adjacent-channel interference. As noted in the legend of the graph of FIG. 4, the received-signal power estimation curve is, in this embodiment, derived from calibration signals having four different interference (tone) values, including zero ("no tone"). The resulting curves do not differ in an amount that is substantial for most applications and, as shown in FIG. 4, appear almost to define a single curve.

When a direct-conversion receiver is manufactured according to the present invention, the receiver's $\log_{10}$ (gain-value product) vs. received-signal power (Y vs. $I_0$) curve may be determined by applying a signal of known power level and determining the resultant gain-value product, then plotting its logarithm against the known power level. Naturally, at least two points must be plotted although it may be desirable to use several. Because the curve is substantially linear, its slope m and y-intercept q may be determined. Note that the "y-axis" where the y-intercept occurs may be arbitrarily set at any received-signal power level, the estimated power levels then being determined relative to the selected value.

In another embodiment (not shown), the Y vs. $I_0$ curve is not a straight line, but can nevertheless be expressed as a function usable by the received-signal power estimating circuit 370 to estimate received-signal power. This will be possible, of course, so long as variation in the amount of interference present does not substantially alter the function. In yet another embodiment (also not shown) a plurality of received-signal power estimation curves are calculated for use in varying environments, or as an alternative to a default curve selected by manual or automatic means.

Figure 5:
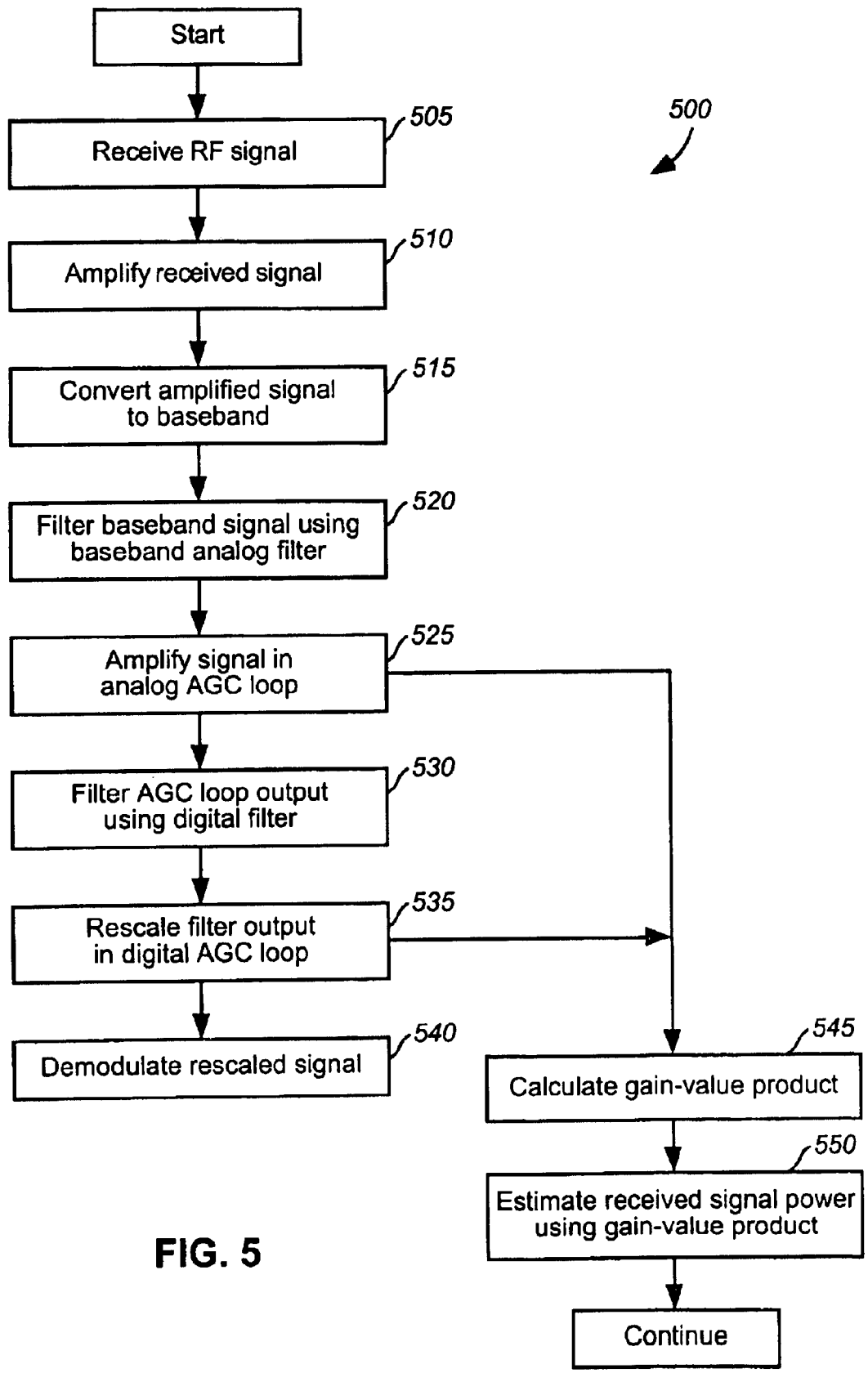
FIG. 5 is a flow diagram illustrating a process of estimating the power of a received CDMA signal according to an embodiment of the present invention.

FIG. 5 is a flow diagram illustrating a method of estimating the power of a received CDMA signal according to an embodiment of the present invention. The process begins at start, where it is assumed that the received-signal power estimation curve (or curves) has been determined according to the procedure discussed above, or some other equivalent method. And note that while a CDMA system is used as an example, the present invention may be equally advantageous when used in connection with systems operating according to other standards as well, providing that a received-signal power estimate is of use in such systems.

The method of FIG. 5 begins when a radio-frequency (RF) signal is received (step 505). Typically, this signal will have been transmitted from a base station and received in a mobile station, though other applications for a receiver constructed and operated according to the present invention may exist as well. The received signal is then amplified (step 510) and converted to baseband (step 515) by the single mixer normally present in a direct-conversion receiver (see FIG. 3). The resulting complex signal is then filtered using an analog baseband filter (step 520). The filtered signal is then passed to and amplified by an analog AGC loop (step 525) that preferably includes a variable amplifier controlled by an analog AGC and an A/D converter that converts the variable-amplifier output before it is input to the AGC.

The output of the A/D converter is also filtered using a digital filter (step 530). The digital filter output is then rescaled in a digital AGC loop (step 535) that include a multiplier that multiplies the digital-filter output and the digital-gain setting from a digital AGC, which receives as input the signal output from the multiplier. The output of the multiplier is also provided to a demodulator circuit where it is demodulated (step 540).

The linear value of the analog AGC gain setting is multiplied by the linear value of the digital AGC gain setting (step 545) to produce a gain-value product. The gain-value product is then used to estimate the received signal strength, $I_O$, (step 540) according to the following relationship:

$$\hat{I}_O = \frac{Y - q}{m} \tag{1.0}$$

where $\hat{I}_O$ is the estimated power, Y=$\log_{10}$ (gain-value product), and m and q are the slope and y-intercept, respectively, as determined by the procedure discussed in reference to FIG. 4, above. The estimated received-signal power may then be used to adjust the transmit power (step not shown) of transmissions from the mobile station to the base station. The method then continues so that the transmission power adjustment may match the most recent received-signal determination.

The device described above is described as a direct-conversion-type receiver, although the present invention may be found equally advantageous when applied to other types of receivers as well. The invention allows for the use of such economical architectures while at the same time providing a way to estimate received-signal power with the accuracy necessary to make the transmission-power adjustments necessary for operation in a CDMA (or CDMA-like) network. Finally, note that the description above provides exemplary and preferred embodiments for implementing the present invention. The scope of the invention, however, should not necessarily be limited by this description. The scope of the present invention is defined by the claims set forth below.

What is claimed is:

1. For use in a radio-telecommunication receiver, the receiver in communication with a telecommunication network, a method for estimating the power of a received signal, the signal including an unknown level of interference, said method comprising the steps of:

amplifying the received signal in an analog AGC loop comprising an analog AGC that produces an analog-gain value;

converting the amplified signal to a digital signal;

rescaling the digital signal in a digital AGC loop comprising a digital AGC that produces a digital-gain value;

multiplying together the analog-gain value and the digital-gain value to produce a gain-value product; and determining an estimated received-signal power level ($\hat{I}_O$) using the gain-value product.

2. The method of claim 1, wherein the analog AGC loop comprises a variable-gain amplifier controlled by the analog gain value produced by the analog AGC.

3. The method of claim 2, wherein the analog AGC loop comprises an analog-to-digital (A/D) converter that receives the output of the variable-gain amplifier and wherein the signal used by the analog AGC to produce the analog-gain value is the output of the A/D converter.

4. The method of claim 3, wherein the converting step is performed by the A/D converter of the AGC loop.

5. The method of claim 1, further comprising the steps of:

amplifying the received signal in an analog AGC loop;

converting the received signal to baseband; and filtering the baseband signal.

6. The method of claim 5, further comprising the step of, prior to the step of converting the received signal to baseband, amplifying the received signal in a low-noise amplifier (LNA).

7. The method of claim 6, wherein the LNA is controlled by a LNA-gain value produced by the analog AGC.

8. The method of claim 1, wherein the received signal is received from a base station in a code-division multiple access (CDMA) network.

9. The method of claim 1, further comprising the step of establishing a received-power estimation curve for the receiver by plotting the logarithm of the gain-value product for at least two calibration signals against the known power level of each respective signal.

10. The method of claim 9, wherein the received-power estimation curve approximates a straight line having a slope (m) and a y-intercept (q).

11. The method of claim 10, wherein the step of determining an estimated power level $\hat{I}_O$ of the received signal is performed by a processor in the receiver using the logarithm Y of the gain-value product according to the equation:

$$\hat{I}_O = \frac{Y - q}{m}$$

12. In a receiver for use in a CDMA-network mobile station, a device for estimating the power of a received signal, said device comprising:

an analog AGC loop for processing the received signal and producing an analog-gain value;

a digital AGC loop for processing the received signal and producing a digital-gain value;

a multiplier for multiplying with each other the analog-gain value and the digital-gain value to produce a gain-value product; and an estimator for using the gain-value product to produce an estimate of the received-signal power.

13. The device of claim 12, further comprising:

a mixer for converting the received signal to baseband; and a baseband filter for filtering the converted signal before it is processed by the analog AGC loop and the digital AGC loop.

14. The device of claim 13, further comprising an amplifier for amplifying the received signal before it is converted to baseband.

15. The device of claim 12, further comprising an A/D converter coupled to the analog AGC loop and to the digital AGC loop for converting the signal processed by the analog AGC loop before it is processed by the digital AGC loop.

16. The device of claim 12, wherein the estimator produces an estimate of the received-signal power ($\hat{I}_O$) according to the equation:

$$\hat{I}_O = \frac{Y - q}{m}$$

wherein Y represents the logarithm of the gain-value product, and q and m represent the y-intercept and slope, respectively, of a predetermined received-signal estimator curve.

* * * * *